United States Patent
Lee et al.

(10) Patent No.: US 11,164,838 B2
(45) Date of Patent: Nov. 2, 2021

(54) SEMICONDUCTOR PACKAGE INCLUDING PLURALITY OF SEMICONDUCTOR CHIPS ON COMMON CONNECTION STRUCTURE

(71) Applicant: SAMSUNG ELECTRONICS CO., LTD., Suwon-si (KR)

(72) Inventors: Yun Tae Lee, Suwon-si (KR); Jung Ho Shim, Suwon-si (KR); Han Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/388,004

(22) Filed: Apr. 18, 2019

(65) Prior Publication Data

US 2020/0266167 A1    Aug. 20, 2020

(30) Foreign Application Priority Data

Feb. 15, 2019 (KR) .................. 10-2019-0017872

(51) Int. Cl.
*H01L 23/00* (2006.01)

(52) U.S. Cl.
CPC .............. *H01L 24/16* (2013.01); *H01L 24/32* (2013.01); *H01L 24/48* (2013.01); *H01L 2224/0236* (2013.01); *H01L 2224/0239* (2013.01); *H01L 2224/02331* (2013.01); *H01L 2224/02333* (2013.01); *H01L 2224/02379* (2013.01); *H01L 2224/16225* (2013.01); *H01L 2224/32225* (2013.01); *H01L 2224/4801* (2013.01); *H01L 2224/73265* (2013.01)

(58) Field of Classification Search
CPC ....... H01L 23/538; H01L 24/16; H01L 24/32; H01L 24/48; H01L 24/82
See application file for complete search history.

(56) References Cited

U.S. PATENT DOCUMENTS

| 8,531,012 B2 | 9/2013 | Lee et al. |
| 9,831,148 B2 | 11/2017 | Yu et al. |
| 2019/0131273 A1* | 5/2019 | Chen ............... H01L 21/568 |
| 2020/0273839 A1* | 8/2020 | Elsherbini .......... H01L 24/19 |

* cited by examiner

*Primary Examiner* — Matthew E. Gordon
(74) *Attorney, Agent, or Firm* — Sughrue Mion, PLLC

(57) ABSTRACT

The present disclosure relates to a semiconductor package including a first semiconductor chip having a first surface on which first connection pads are disposed, and a second surface on which second connection pads are disposed, and including through-vias connected to the second connection pads; a connection structure disposed on the first surface and including a first redistribution layer; a first redistribution disposed on the second surface; and a second semiconductor chip disposed on the connection structure. The first connection pads are connected to a signal pattern of the first redistribution layer, and the second connection pads are connected to at least one of a power pattern and a ground pattern of the second redistribution layer.

17 Claims, 14 Drawing Sheets

SEMICONDUCTOR PACKAGE INCLUDING PLURALITY OF SEMICONDUCTOR CHIPS ON COMMON CONNECTION STRUCTURE

CROSS-REFERENCE TO RELATED APPLICATIONS

This application claims the benefit of priority to Korean Patent Application No. 10-2019-0017872 filed on Feb. 15, 2019 in the Korean Intellectual Property Office, the disclosure of which is incorporated herein by reference in its entirety.

TECHNICAL FIELD

The present disclosure relates to a semiconductor package, and in particular, a fan-out semiconductor package.

BACKGROUND

With recent developments in smart electronic devices, there has been increasing demand for components used in such smart electronic devices to meet more advanced performance requirements. For example, performance specifications of an application processor (AP), which is one of the core components of a smart electronic device, have advanced dramatically in recent years. One among many methods for improving performance of an AP involves partitioning the AP by function. For example, the AP can be manufactured by partitioning a die by function, and configuring and packaging the partitioned die into semiconductor chips by optimal processes suitable for characteristics of the die, and an AP thus manufactured may achieve superior performance as compared to a conventional single AP. However, implementation of such an AP requires a more advanced semiconductor packaging technique. In this context, it is necessary to develop a package structure capable of packaging a plurality of partitioned semiconductor chips to have optimal signal and power characteristics.

SUMMARY

An aspect of the present disclosure is to provide a package structure capable of packaging a plurality of semiconductor chips to have optimal signal and power characteristics.

According to an aspect of the present disclosure, a semiconductor package includes through-vias penetrating a semiconductor chip and connection pads of the semiconductor chip are configured to transmit different signals indifferent directions from each other.

An aspect of the present disclosure is to provide a semiconductor package including: a first semiconductor chip having a first surface and a second surface opposing the first surface, and including first and second connection pads disposed on the first and second surfaces, respectively, and through-vias connected to the second connection pads; a connection structure disposed on the first surface of the first semiconductor chip and including a first redistribution layer electrically connected to the first connection pads of the first semiconductor chip; a second redistribution layer disposed on the second surface of the first semiconductor chip and electrically connected to the second connection pads of the first semiconductor chip; and a second semiconductor chip disposed on a third surface of the connection structure opposing a fourth surface of the connection structure on which the first semiconductor chip is disposed. A surface of the second semiconductor chip on which third connection pads of the second semiconductor chip are disposed faces the fourth surface of the connection structure. The first connection pads of the first semiconductor chip are connected to a signal pattern of the first redistribution layer, and the second connection pads of the first semiconductor chip are connected to at least one of a power pattern and a ground pattern of the second redistribution layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings. In the accompanying drawings, shapes, sizes, and the like, of components may be exaggerated or simplified for clarity.

Electronic Device

Figure 1:
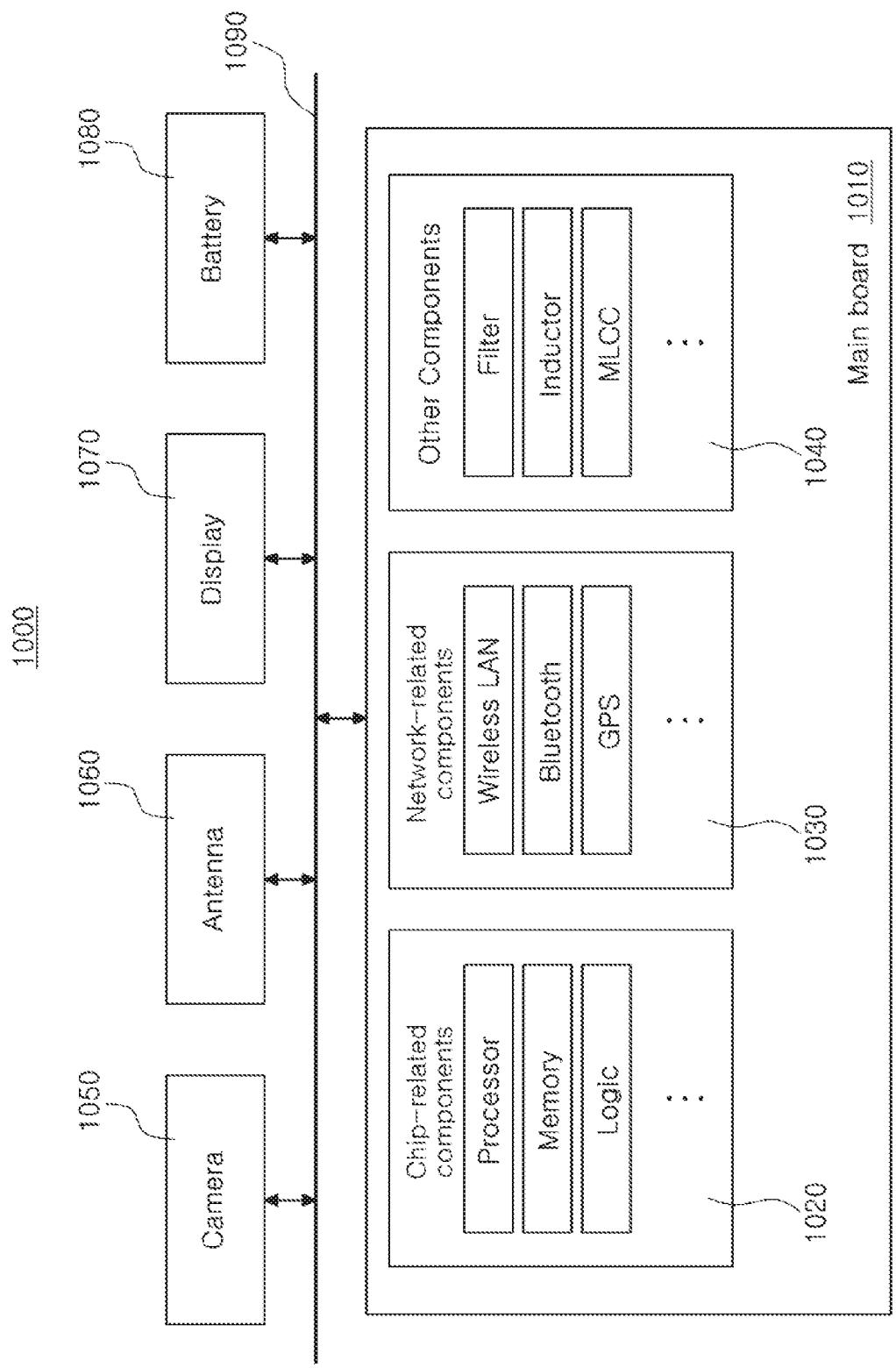
FIG. 1 is a block diagram schematically illustrating an example of an electronic device system.

FIG. 1 is a block diagram schematically illustrating an example of an electronic device system.

Referring to the drawings, an electronic device 1000 may accommodate a mainboard 1010 therein. The mainboard 1010 may include chip-related components 1020, network-related components 1030, other components 1040, and the like, physically or electrically connected to the mainboard

1010. These components may be connected to other components, which will be described below, to form various signal lines 1090.

The chip-related components 1020 may include a memory chip such as a volatile memory (for example, a dynamic random access memory (DRAM)), a non-volatile memory (for example, a read only memory (ROM)), a flash memory, and the like; an application processor chip such as a central processor (for example, a central processing unit (CPU)), a graphics processor (for example, a graphics processing unit (GPU)), a digital signal processor, a cryptoprocessor, a microprocessor, a microcontroller, and the like; and a logic chip such as an analog-to-digital (ADC) converter, an application-specific integrated circuit (ASIC), and the like. However, the chip-related components 1020 are not limited thereto, and may also include other types of chip-related components. In addition, these chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include various other wireless or wired standards or protocols. In addition, the network-related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but may also include passive components used for various other purposes, or the like. In addition, the other components 1040 may be combined with each other, together with the chip-related components 1020 or the network-related components 1030 described above.

Depending on the type of the electronic device 1000, the electronic device 1000 may include other components that may or may not be physically and/or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes or the like, depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device capable of processing data.

Figure 2:
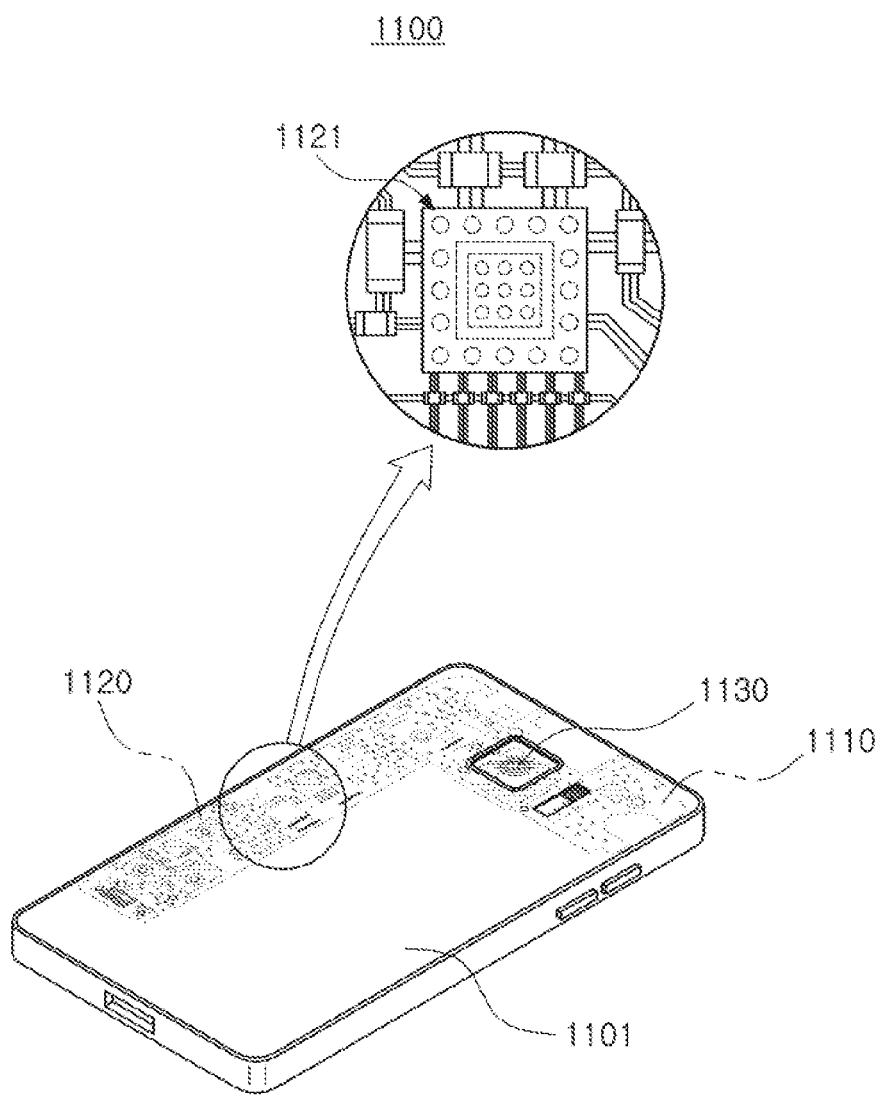
FIG. 2 is a perspective view schematically illustrating an example of an electronic device.

FIG. 2 is a perspective view schematically illustrating an example of an electronic device.

Referring to the drawings, a semiconductor package can be applied to various electronic devices for various purposes as described above. For example, a printed circuit board 1110 is accommodated within a body 1101 of a smartphone 1100, and various components 1120 are physically and/or electrically connected to the printed circuit board 1110. Also, other components, such as a camera 1130, which may or may not be physically and/or electrically connected to the printed circuit board 1110, are accommodated within the body 1101. Some of the components 1120 may be chip-related components, for example, a semiconductor package 1121, but are not limited thereto. The electronic device is not limited to the smartphone 1100 and may be any other electronic device as described above.

Semiconductor Package

Generally, numerous fine electrical circuits are integrated in a semiconductor chip. However, the semiconductor chip alone cannot serve as a finished semiconductor product due to its vulnerability to external physical or chemical impacts. Therefore, the semiconductor chip, rather than being used in its bare state, is often packaged and used in a packaged state in an electronic device or the like.

Semiconductor packaging is needed because, in terms of electrical connection, there is a difference in width between the circuits of a semiconductor chip and the circuits of a mainboard of an electronic device. More specifically, in case of a semiconductor chip, sizes of connection pads and gaps between such connection pads are extremely fine, whereas in case of a mainboard used in electronic devices, sizes of component mounting pads and gaps between such component mounting pads are on a significantly larger scale compared to a semiconductor chip. Accordingly, it is difficult to mount a semiconductor chip directly on such a mainboard, and therefore, a packaging technique capable of addressing such a different circuit width between the mainboard and the semiconductor is necessary.

A semiconductor package fabricated by such a packaging technique can be classified as a fan-in semiconductor package or a fan-out semiconductor package depending on the structure and the intended use thereof.

Hereinbelow, the fan-in semiconductor package and the fan-out semiconductor package will be described in greater detail with reference to the drawings.

Fan-in Semiconductor Package

Figure 3A:
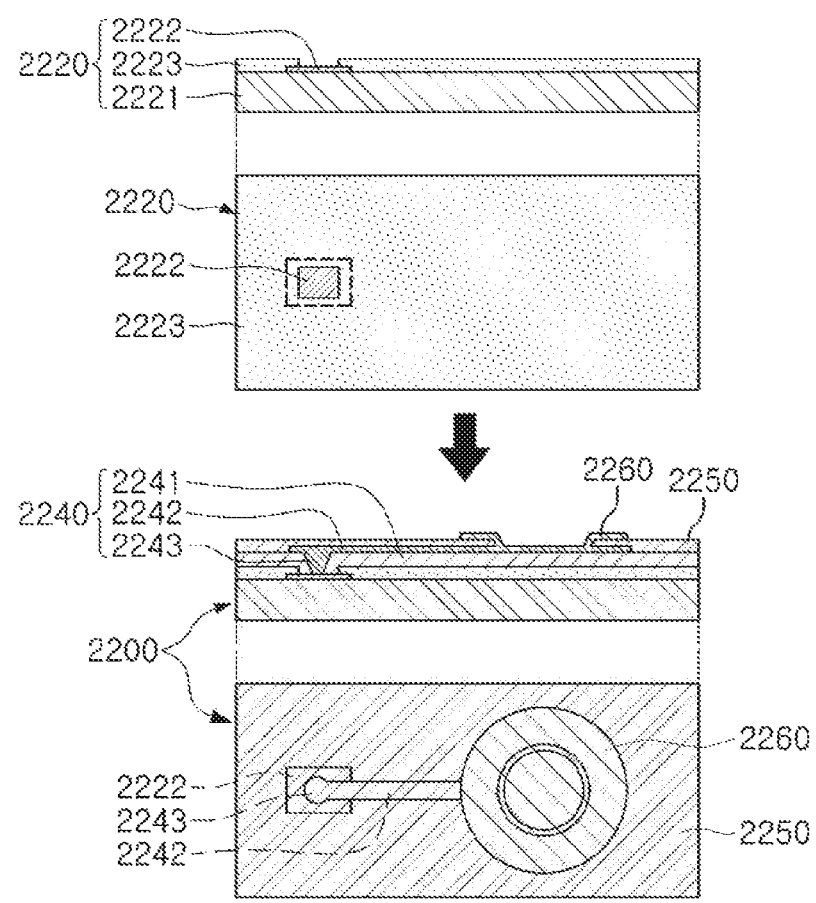
FIG. 3a and FIG. 3b are cross-sectional views schematically illustrating a fan-in semiconductor package before and after packaging.
Figure 3B:
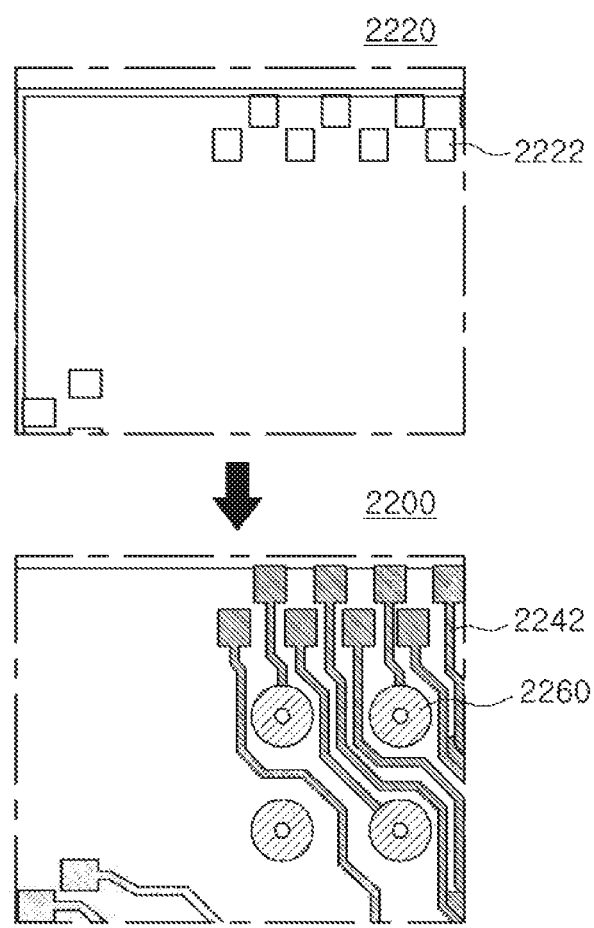

FIGS. 3A and 3B are cross-sectional views schematically illustrating states of a fan-in semiconductor package before and after being packaged.

Figure 4:
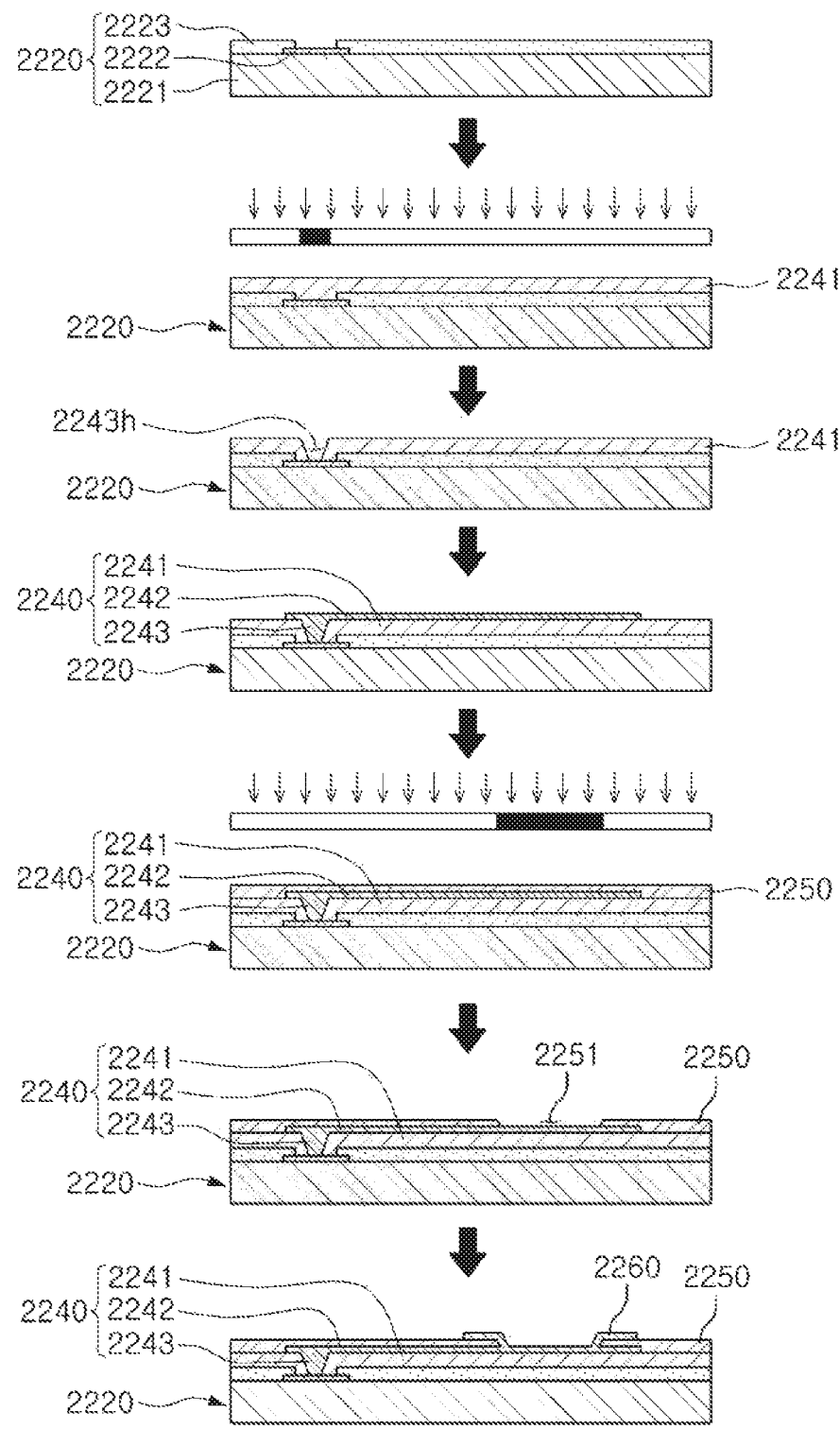
FIG. 4 is a cross-sectional view schematically illustrating a packaging process of a fan-in semiconductor package.

FIG. 4 is a cross-sectional view schematically illustrating a packaging process of a fan-in semiconductor package.

Referring to the drawings, a semiconductor chip 2220 may be, for example, an integrated circuit (IC) in a bare state, including a body 2221 containing silicon (Si), germanium (Ge), gallium arsenide (GaAs), or the like, connection pads 2222 formed on one surface of the body 2221 and containing a conductive material such as aluminum (Al) and the like, and a passivation film 2223 such as an oxide film, a nitride film, and the like, formed on one surface of the body 2221 and disposed to cover at least portions of the connection pads 2222. Here, since the connection pads 2222 are extremely small, it is difficult to mount the IC even on an intermediate level printed circuit board (PCB), not to mention on the mainboard of an electronic device.

To address this issue, a connection member 2240 accommodating the size of the semiconductor chip 2220 may be formed on the semiconductor chip 2220 to redistribute the connection pads 2222. The connection structure 2240 may be formed by forming an insulating layer 2241 on the semiconductor chip 2220 using an insulating material such as a photoimagable dielectric (PID) resin, thereafter forming via holes 2243h for opening the connection pads 2222, and then forming wiring patterns 2242 and vias 2243. Next, a passivation layer 2250 for protecting the connection structure 2240 is formed, an opening 2251 is formed, and under-bump metal layers 2260 or the like are formed. In other words, through a series of processes, a fan-in semiconductor package 2200 including, for example, the semiconductor chip 2220, the connection structure 2240, the passivation layer 2250, and the under-bump metal layers 2260, can be fabricated.

As described above, the fan-in semiconductor package is a package form in which all of the connection pads such as input/output (I/O) terminals, of the semiconductor chip are disposed inside the semiconductor chip, and the fan-in semiconductor package has excellent electrical characteristics and can be fabricated inexpensively. Therefore, many elements mounted in smartphones have been fabricated in a fan-in semiconductor package form. More specifically, many elements mounted in smartphones have been developed so as to implement a rapid signal transfer while having a small size.

However, since all I/O terminals need to be disposed inside the semiconductor chip in the fan-in semiconductor package, the fan-in semiconductor package has a significant space limitation. Therefore, it is difficult to apply this structure to a semiconductor chip with a large number of I/O terminals or a semiconductor chip having a compact size. Furthermore, due to the disadvantages described above, the fan-in semiconductor package cannot be used on the mainboard of an electronic device by being directly mounted thereon, because even when sizes of I/O terminals of a semiconductor chip and gaps between the I/O terminals are enlarged through a redistribution process, the sizes of the I/O terminals and the gaps between the I/O terminals of the semiconductor chip may not be sufficient to permit the fan-in semiconductor package to be directly mounted on the mainboard of the electronic device.

Figure 5:
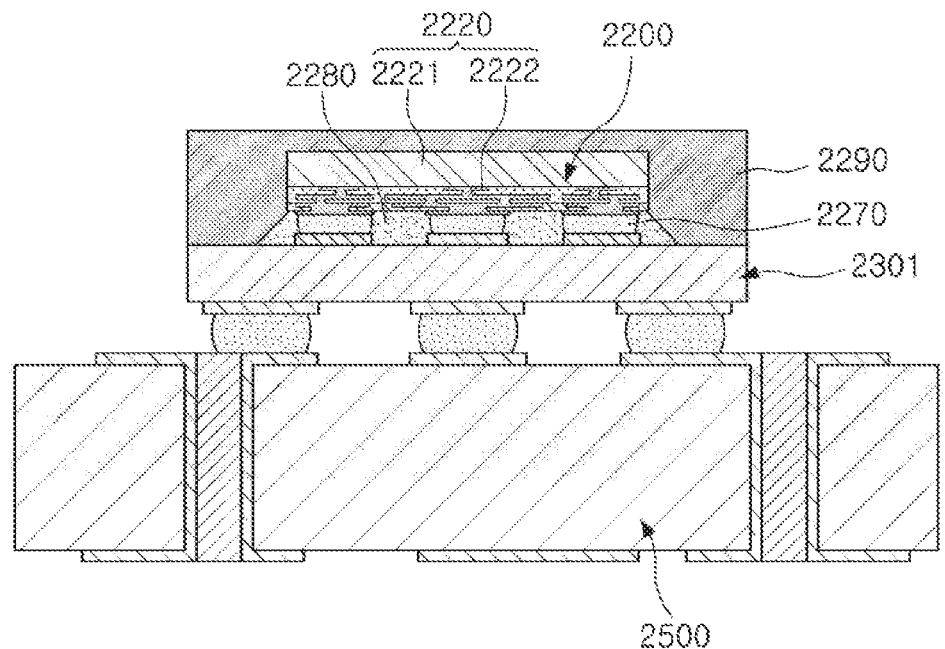
FIG. 5 is a cross-sectional view schematically illustrating a case in which a fan-in semiconductor package is mounted on an interposer substrate and is finally mounted on a mainboard of an electronic device.

FIG. 5 is a cross-sectional view schematically illustrating a case in which a fan-in semiconductor package is mounted on an interposer substrate and is finally mounted on a mainboard of an electronic device.

Figure 6:
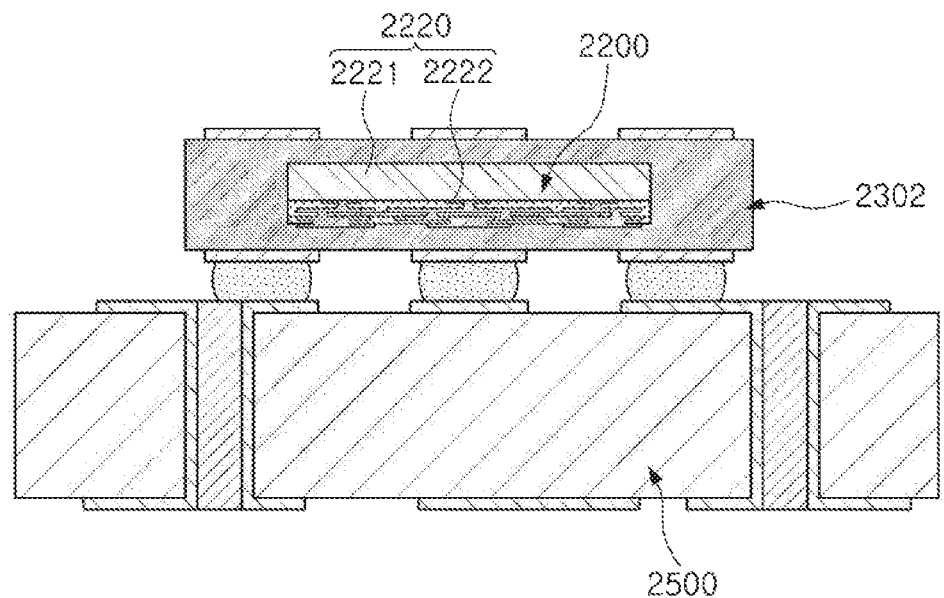
FIG. 6 is a cross-sectional view schematically illustrating a case in which a fan-in semiconductor package is embedded in an interposer substrate and is finally mounted on a mainboard of an electronic device.

FIG. 6 is a cross-sectional view schematically illustrating a case in which a fan-in semiconductor package is embedded in an interposer substrate and is finally mounted on a mainboard of an electronic device.

Referring to the drawings, in a fan-in semiconductor package 2200, connection pads 2222, that is, I/O terminals of a semiconductor chip 2220, may be redistributed through an interposer substrate 2301, and the fan-in semiconductor package 2200, by being mounted on the interposer substrate 2301, can be finally mounted on a mainboard 2500 of an electronic device. In this case, solder balls 2270 or the like may be fixed by an underfill resin 2280 or the like, and an outer surface of the semiconductor chip 2220 may be covered with a molding material 2290 or the like. Alternatively, the fan-in semiconductor package 2200 may be embedded in a separate interposer substrate 2302, and while being embedded in the interposer substrate 2302, the connection pads 2222, that is, I/O terminals of the semiconductor chip 2220 may be redistributed through the interposer substrate 2302, and then the fan-in semiconductor package 2200 may be finally mounted on the mainboard 2500 of an electronic device.

As described above, since it is difficult to use a fan-in semiconductor package by directly mounting it on the mainboard of an electronic device, the fan-in semiconductor package may be mounted on a separate interposer substrate first, and then mounted on the mainboard of the electronic device through a packaging process, or alternatively, the fan-in semiconductor package, while being embedded in the interposer substrate, may be mounted and used on a mainboard of the electronic device.

Fan-Out Semiconductor Package

Figure 7:
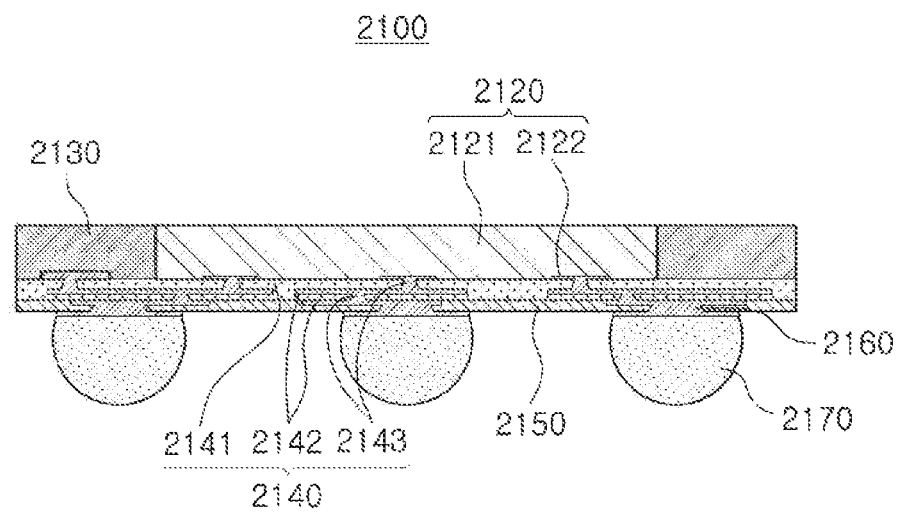
FIG. 7 is a schematic cross-sectional view of a fan-out semiconductor package.

FIG. 7 is a cross-sectional view schematically illustrating a fan-out semiconductor package.

Referring to the drawings, in a fan-out semiconductor package 2100, the outside of a semiconductor chip 2120 is protected by an encapsulant 2130, and connection pads 2122 of the semiconductor chip 2120 are redistributed even to the outside of the semiconductor chip 2120 by a connection structure 2140. Here, a passivation layer 2202 may be further formed on the connection structure 2140, and an under-bump metal layer 2160 may be further formed in an opening of the passivation layer 2202. Solder balls 2170 may be further formed on the under-bump metal layer 2160. The semiconductor chip 2120 may be an integrated circuit including a body 2121, the connection pad 2122, a passivation film (not illustrated), and the like. The connection structure 2140 may include an insulating layer 2141, redistribution layers 2142 formed on the insulating layer 2241, and vias 2143 configured to electrically connect the connection pads 2122, the redistribution layers 2142, and the like.

As described above, the fan-out semiconductor package may have a form in which I/O terminals of the semiconductor chips are redistributed and extended to the outside the semiconductor chips through the connection member formed on the semiconductor chips. As described above, in the fan-in semiconductor package, all I/O terminals of the semiconductor chips need to be disposed inside the semiconductor chips. Therefore, when sizes of the semiconductor chips decrease, a size and a pitch of balls need to decrease as well, thereby making it difficult for the fan-in semiconductor package to utilize a standardized ball layout. On the other hand, the fan-out semiconductor package has the form in which the I/O terminals of the semiconductor chip are redistributed and disposed outside the semiconductor chip through the interconnection member formed on the semiconductor chip as described above. Therefore, even when sizes of the semiconductor chips decrease, the fan-out semiconductor package can utilize a standardized ball layout as it is, so that the fan-out semiconductor package can be mounted on the mainboard of an electronic device without using a separate interposer substrate, as described below.

Figure 8:
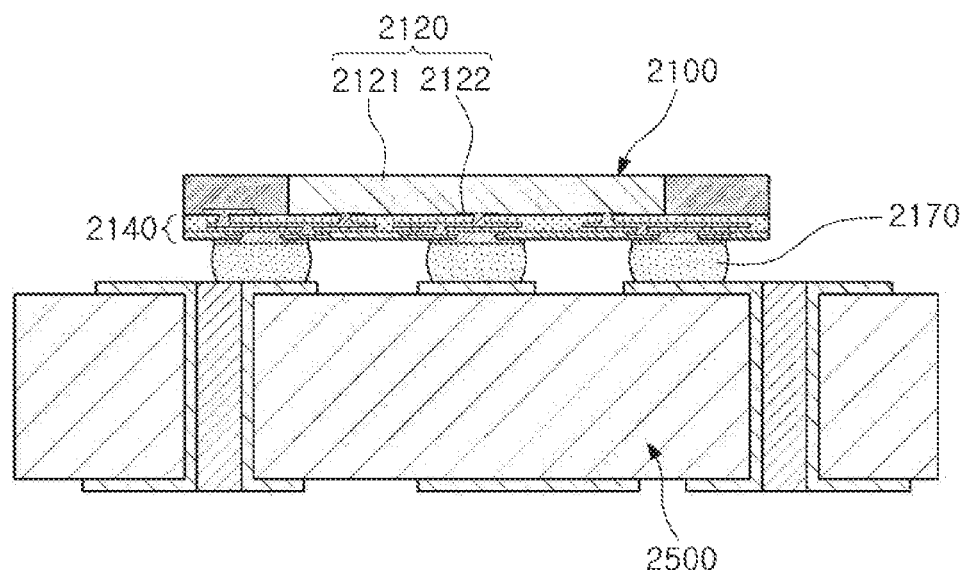
FIG. 8 is a cross-sectional view schematically illustrating a fan-out semiconductor package mounted on a mainboard of an electronic device.

FIG. 8 is a cross-sectional view schematically illustrating a fan-out semiconductor package mounted on a mainboard of an electronic device.

Referring to the drawings, the fan-out semiconductor package 2100 may be mounted on a mainboard 2500 of an electronic device by a solder ball 2170 and the like. In other words, as described above, the fan-out semiconductor package 2100 includes a connection structure 2140 formed on the semiconductor chip 2120 and capable of redistributing connection pads 2122 to a fan-out region that is outside the size of the semiconductor chip 2120, such that a standardized ball layout can be used in the fan-out semiconductor package 2100 as it is. Thus, the fan-out semiconductor package 2100 may be mounted on the mainboard 2500 of the electronic device without using a separate interposer substrate or the like.

As described above, since the fan-out semiconductor package can be mounted on the mainboard of the electronic device without using the separate interposer substrate, the fan-out semiconductor package can have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to a packaging technique for mounting the semiconductor chip on the mainboard of the electronic device, or the like, as described above, and protecting the semiconductor chip from external impacts, and is a concept different from that of a printed circuit board (PCB) such as an interposer substrate or the like, also having a scale, a purpose, and the like, different from those of the fan-out semiconductor package, and having the fan-in semiconductor package embedded therein.

Hereinbelow, a package structure capable of packaging a plurality of semiconductor chips with optimal signal and power characteristics will be described with reference to the drawings.

Figure 9:
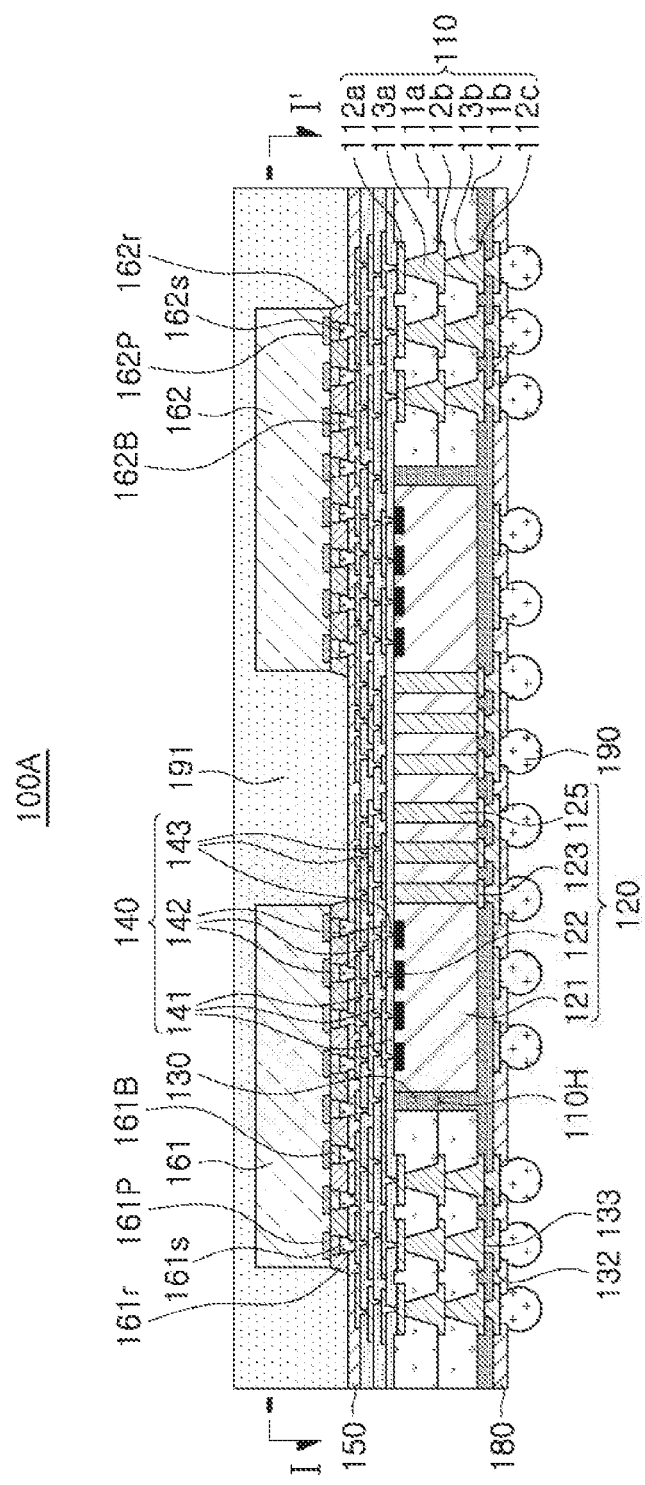
FIG. 9 is a cross-sectional view schematically illustrating an example of a semiconductor package.

FIG. 9 is a schematic cross-sectional view of an example of a semiconductor package.

Figure 10:
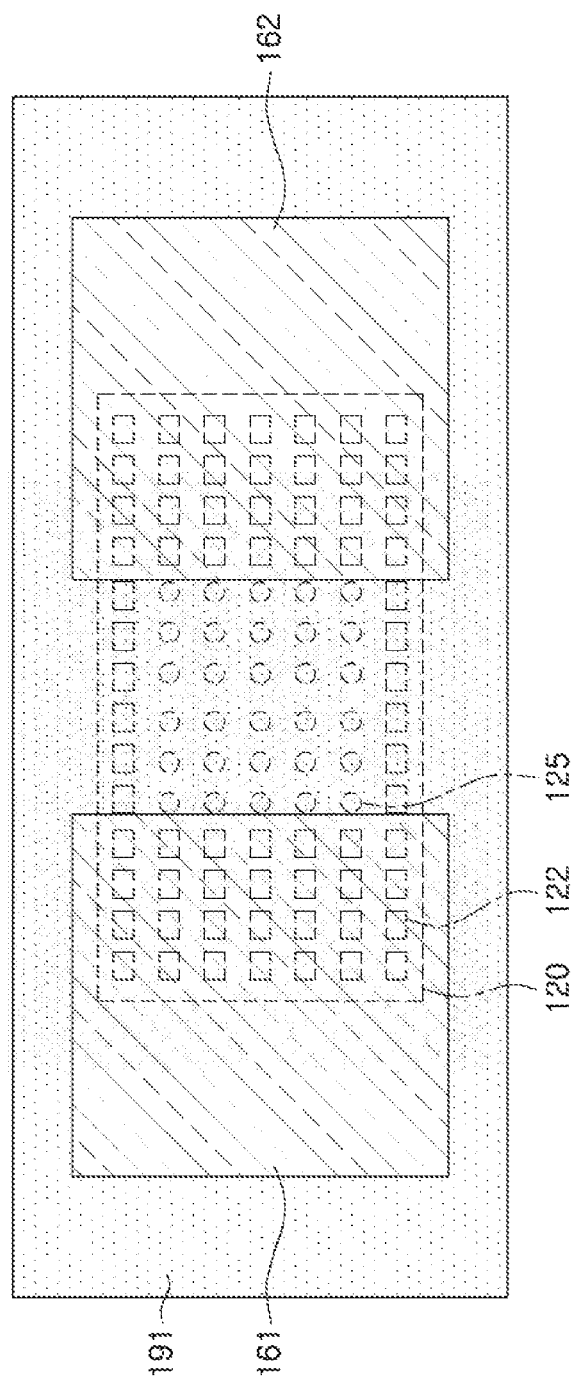
FIG. 10 is a plan view of the semiconductor package of FIG. 9, taken along line I-I' of FIG. 9.

FIG. 10 is a plan view of the semiconductor package of FIG. 9, taken along line I-I' of FIG. 9.

Referring to the drawings, a semiconductor package 100A according to an example embodiment includes: a connection structure 140 having an upper surface and a lower surface opposite to each other; a frame 110 disposed on the lower surface of the connection structure 140 and having a through-hole 110H; a first semiconductor chip 120 disposed in the through-hole 110H on the lower surface of the connection structure 140; an encapsulant 130 disposed on the lower surface of the connection structure 140, covering at least a portion of each of the frame 110 and the first semiconductor chip 120, and filling at least a portion of the through-hole 110H; a first passivation layer 150 disposed on the upper surface of the connection structure 140; second and third semiconductor chips 161 and 162 disposed on the first passivation layer 150; a molding material 191 disposed on the first passivation layer 150 and covering at least a portion of each of the second and third semiconductor chips 161 and 162; a second redistribution layer 132 disposed below the frame 110; a second passivation layer 180 disposed to cover the second redistribution layer 132; and a plurality of electrical connection metals 190.

The first semiconductor chip 120 includes a body portion 121, first and second connection pads 122 and 123, and through-vias 125. Of the first semiconductor chip 120, one surface on which the first connection pads 122 are disposed may be an active surface, whereas an opposing surface opposite to the one surface and on which the second connection pads 123 are disposed may be an inactive surface, but the first semiconductor chip 120 is not limited thereto. In particular, the second connection pads 123 may be disposed protruding from the inactive surface of the first semiconductor chip 120, but are not limited thereto. The through-vias 125 are connected to the second connection pads 123 and extend from the second connection pads 123 to the active surface or to a region in proximity to the active surface, by penetrating at least a portion of the body portion 121 of the first semiconductor chip 120. For example, the through-vias 125 may extend to penetrate the entire first semiconductor chip 120, or may extend from the second connection pads 123 to penetrate at least a portion of an active layer disposed in contact with the active surface and having semiconductor devices disposed thereon. The through-vias 125 may be electrically connected to the semiconductor devices inside the first semiconductor chip 120. In a case in which the body portion 121 is made of silicon, the through-vias 125 may be through-silicon vias (TSVs).

In the first semiconductor chip 120, the first connection pads 122 are electrically connected to the first redistribution layer 142 of the connection structure 140 disposed thereabove. The through-vias 125 are electrically connected to the second redistribution layer 132 disposed therebelow through the second connection pads 123. In particular, the first connection pads 122 are connected to a signal pattern of the first redistribution layer 142, and the through-vias 125 are connected to a power pattern and/or a ground pattern of the second redistribution layer 132. Accordingly, in the first semiconductor chip 120, signals, for example, data signals, can be transmitted and received through the first connection pads 122, and power can be supplied through the through-vias 125.

In order to improve the performance of an AP, which is one of the core components of a smart electronic device, an AP may be partitioned by function. For example, an AP may be fabricated by partitioning a die by function, and designing and packaging the partitioned die into semiconductor chips by optimal processes according to characteristics of the die, and the AP thus fabricated may exhibit superior performance as compared to a conventional single AP.

In this context, in the semiconductor package 100A according to an example embodiment, the first semiconductor chip 120 and the second and third semiconductor chips 161 and 162, which are capable of performing different functions from each another, are each disposed on either surface of the connection structure 140 including one or more first redistribution layers 142, such that the first connection pads 122 and third and fourth connection pads 161P and 162P of the second and third semiconductor chips 161 and 162 are disposed facing each other with the connection structure 140 disposed therebetween. The first semiconductor chip 120 is disposed on the lower surface of the connection structure 140, such that the active surface having the first connection pads 122 disposed thereon faces the lower surface of the connection structure 140. The second and third semiconductor chips 161 and 162 are disposed on the upper surface of the connection structure 140, such that active surfaces of the second and third semiconductor chips 161 and 162, having the third and fourth connection pads 161P and 162P disposed thereon, respectively, face the upper surface of the connection structure 140. The second and third semiconductor chips 161 and 162 may be disposed such that, when viewed from a plan view, at least a portion of each of the second and third semiconductor chips 161 and 162 vertically overlaps the first semiconductor chip 120. Each of the first to third semiconductor chips 120, 161, and 162 may be a chip constituting at least part of the function of an application processor (AP). In other words, each of the first to third semiconductor chips 120, 161, and 162 may constitute a partial or entire function of the AP.

As illustrated in FIG. 10, the first connection pads 122 may be disposed mostly in an overlapped region on the active surface of the first semiconductor chip 120, overlapping the second or third semiconductor chip 161 or 162. On the other hand, the through-vias 125 and the second connection pads 123 connected thereto are disposed in a region including a central region of the first semiconductor chip 120, while at least a portion of the through-vias 125 and the second connection pads 123 may be disposed in a region of the first semiconductor chip 120 that does not overlap the second or third semiconductor chips 161 and 162. The first connection pads 122 and the second connection pads 123 may be arranged so as to not overlap each other when viewed from a plan view, but are not limited thereto. For example, the numbers of rows and columns of the first connection pads 122 and the through-vias 125 may be variously modified when viewed on a plan view.

Here, a portion of the first connection pads 122 are vertically and electrically connected to a portion of the third and fourth connection pads 161P and 162P in the overlapped region by a signal pattern. Another portion of the first connection pads 122 is electrically connected to the second redistribution layer 132 by the first redistribution layers 142 and the frame 110. Another portion of each of the third and fourth connection pads 161P and 162P may be electrically connected to power and/or ground patterns of the first redistribution layers 142, mostly in regions not overlapped with the first semiconductor chip 120. As described above, by the signal pattern of the first redistribution layers 142 of the connection structure 140, and first connection vias 143 connected thereto, the first semiconductor chip 120 and the second and third semiconductor chips 161 and 162 may be vertically connected and also signal-connected to each other. Accordingly, since the first to third semiconductor chips 120, 161, and 162 can be connected to each other by a shortest distance, signal characteristics can be optimized, and furthermore, since the first semiconductor chip 120 and the electrical connection metals 190 can be connected to each other by a shortest distance, power characteristics can be optimized.

Hereinbelow, the respective components included in the semiconductor package 100A according to an example embodiment will be described in greater detail.

The frame 110 includes a through-hole 110H in the shape of a through hole. The first semiconductor chip 120 is disposed in the through-hole 110H, such that a surface of the first semiconductor chip 120 on which the first connection pads 122 are disposed faces the lower surface of the connection structure 140. Here, the first connection pads 122 may be connected to the first connection vias 143 of the connection structure 140 without using bumps. Furthermore, the frame 110 includes: a first insulating layer 111a disposed in contact with the lower surface of the connection structure 140; a first wire layer 112a disposed in contact with the lower surface of the connection structure 140 and buried in one surface of the first insulating layer 111a; a second wire layer 112b disposed on the other surface of the first insulating layer 111a, opposing the one surface of the first insulating layer 111a in which the first wire layer 112a is buried, the second insulating layer 111b disposed to cover at least a portion of the second wire layer 112b; a third wire layer 112c disposed on one surface of the second insulating layer 111b, opposite to the other surface of the second insulating layer 111b in which the second wire layer 112b is buried; a first wire/via layer 113a disposed to penetrate the first insulating layer 111a to electrically connect the first and second wire layers 112a and 112b to each other; and a second wire/via layer 113b penetrating the second insulating layer 111b to electrically connect the second and third wire layers 112b and 112c to each other. The frame 110 may serve as a support member.

The first wire layer 112 may be recessed into the first insulating layer 111a. In other words, the side of the first insulating layer 111a that is in contact with the lower surface of the connection structure 140 may have a step with respect to the side of the first wire layer 112a that is in contact with the connection structure 140. This may prevent encapsulant material from bleeding out to contaminate the first wire layer 112a when encapsulating the first semiconductor chip 120 and the frame 110 with the encapsulant 130. The thickness of each of the first to third wire layers 112a, 112b, and 112c may be greater than the thickness of each of the first redistribution layers 142.

Since some pads of the first wire layer 112a can act as a stopper when forming a hole for the first wire/via layers 113a, it may be advantageous in terms of processing if a connection via of each of the first wire/via layers 113a is tapered such that a width of an upper surface of the connection via is smaller than a width of a lower surface of the connection via. In this case, the wire vias of the first wire/via layers 113a may be integrated with patterns of the second wire layers 112b. Likewise, since some pads of the second wire layer 112b can act as a stopper when forming a hole for the second wire/via layer 113b, it may be advantageous in terms of processing if a connection via of the second wire/via layer 113b is tapered such that a width of an upper surface of the connection via is smaller than a width of a lower surface of the connection via. In this case, the wire via of the second wire/via layer 113b may be integrated with a pad pattern of the third wire layer 112c.

For the first and second insulating layers 111a and 111b, an insulating material may be used. In this case, the insulating material may be a thermosetting resin such as an epoxy resin, a thermoplastic resin such as a polyimide resin, or a resin in which the thermosetting resin, the thermoplastic resin, or the like is impregnated with inorganic filler in a core material such as glass fibers (glass cloth, glass fabric, etc.). For example, prepreg, Ajinomoto Build up Film (ABF), FR-4, Bismaleimide Triazine (BT), or the like may be used.

The first to third wire layers 112a, 112b, and 112c may play the role of redistributing the first connection pads 122 of the first semiconductor chip 120, and may play the role of providing pad patterns for the wire/via layers 113a and 113b for connecting upper and lower portions of the semiconductor package 100A. The first to third wire layers 112a, 112b, and 112c may be formed of a metal material. Examples of the metal material include copper (Cu), aluminum (Al), silver (Ag), tin (Sn), gold (Au), nickel (Ni), lead (Pb), titanium (Ti), and alloys thereof. The first to third wire layers 112a, 112b, and 112c may perform various functions in accordance with a circuit design of a corresponding layer. For example, the first to third wire layers 112a, 112b, and 112c may include ground (GrouND: GND) patterns, power (PoWeR: PWR) patterns, signal (Signal: S) patterns, and the like. Here, the S patterns include various signals such as data signals, excluding GND patterns and PWR patterns related to a power source and the like.

The first and second wire/via layers 113a and 113b are configured to electrically connect to each other, the first to third wire layers 112a, 112b, and 112c formed at different levels from each other, thus forming an electrical path inside the frame 110. In addition, the first and second wire/via layers 113a and 113b form an electrical path between the connection structure 140 and the electrical connection metals 190. The first and second wire/via layers 113a and 113b may be formed of a metal material. Each of the first and second wire/via layers 113a and 113b may be a filled-type via completely filled with a metal material, or may be a conformal-type via in which a metal material is formed along the inner wall of a via hole. Also, each of the first and second wire/via layers 113a and 113b may have a tapered shape. Furthermore, the first and second wire/via layers 113a and 113b may be integrated with at least portions of the first to third wire layers 112a, 112b, and 112c, but are not limited thereto.

The first semiconductor chip 120 may be an integrated circuit (IC) in which more than several hundreds to several millions of devices are integrated in a single chip. For example, the first semiconductor chip 120 may be a processor chip such as a central processor (for example, CPU), a graphic processor (for example, GPU), a field-programmable gate array (FPGA), a digital signal processor, an encryption processor, a microprocessor, a microcontroller, and the like, and in particular, the first semiconductor chip 120 may be an application processor (AP), but is not limited thereto. The first semiconductor chip 120 may be a chip forming a partial function of an AP, examples of the partitioned chip including a central processor (CPU), a graphics processor (GPU), a microprocessor and/or a microcontroller, and the like. Alternatively, the first semiconductor chip 120 may be a partitioned chip having a function not disclosed herein.

The first semiconductor chip 120 may be formed using an active wafer, and in this case, silicon (Si), germanium (Ge), gallium arsenic (GaAs), or the like may be used as the base material for forming a body portion 121. The body portion 121 may have various semiconductor devices and circuits formed therein. The first and second connection pads 122 and 123 and the through-vias 125 are configured to electrically connect the first semiconductor chip 120 to other components, and may be formed of a conductive material, such as aluminum (Al) and copper (Cu), but are not limited thereto. In the body portion 121, there may be further formed a passivation film exposing the first and second connection pads 122 and 123, wherein the passivation film may be an oxide layer, a nitride layer, or the like, or may be a double layer including an oxide layer and a nitride layer. The first semiconductor chip 120 may be a bare die or, if necessary, may be a packaged die in which additional redistribution layers are further formed on the surface with the first connection pads 122 disposed thereon, namely the active surface.

The encapsulant 130 may serve to protect the frame 110, the first semiconductor chip 120, and the like. The encapsulation form of the encapsulant 130 is not limited to any particular form. For example, the encapsulant 130 may be disposed to cover the surface on which the frame 110 and the second connection pads 123 of the first semiconductor chip 120 are disposed, and may fill at least a portion of the through-hole 110H. Since the encapsulant 130 fills the through-hole 110H, depending on the specific type of material that constitutes the encapsulant 130, the encapsulant 130 may function as an adhesive and reduce buckling at the same time.

The encapsulant 130 is not limited to any particular material. For example, the encapsulant 130 may be formed by an insulating material, and examples of the insulating material may be a thermosetting resin such as an epoxy resin, a thermoplastic resin such as a polyimide resin, a resin in which the thermosetting resin, the thermoplastic resin, or the like is impregnated with an inorganic filler in a core material such as glass fibers (glass cloth, glass fabric, etc.). For example, prepreg, ABF, FR-4, BT, or the like may be used. If necessary, a photoimagable encapsulant (PIE) resin may be used.

The connection structure 140 may redistribute the first, third, and fourth connection pads 122, 161P, and 162P of the first to third semiconductor chips 120, 161, and 162. Also, the connection structure 140 may electrically connect the first, third, and fourth connection pads 122, 161P, and 162P to each another according to functions thereof. Also, the connection structure 140 may electrically connect the first, third, and fourth connection pads 122, 161P, and 162P to the wire layers 112a, 112b, and 112c of the frame 110 according to functions thereof. Several tens to several millions of the first, third, and fourth connection pads 122, 161P, and 162P having various functions can be redistributed by the connection structure 140. Moreover, through the electrical connection metals 190, the first, third, and fourth connection pads 122, 161P, and 162P may be physically and/or electrically further connected to external components according to their respective functions.

The insulating layers 141 may be formed by an insulating material. Examples of the insulating material include a photosensitive insulating material, such as PID resin, in addition to the aforementioned examples of insulating material. In other words, each of the insulating layers 141 may be a photosensitive insulating layer. When the insulating layers 141 have photosensitive properties, the insulating layers 141 can be more thinly fabricated, thus allowing a fine pitch of the first connection vias 143 to be implemented more easily. Each of the insulating layers 141 may be a photosensitive insulating layer containing an insulating resin and inorganic filler. When the insulating layers 141 are provided in multiple layers, they may be of the same material or of different materials as needed. If the insulating layers 141 are provided in multiple layers, they may be of the same material or of different materials as needed. The insulating layers 141 provided in multiple layers may be processed such that they are integrated with each other, and boundaries between two adjacent insulating layers 141 may be indistinct; however, the insulating layers 141 are not limited thereto.

The first redistribution layers 142 may substantially redistribute the first, third, and fourth connection pads 122, 161P, and 162P, and may provide the electrical path described above. The first redistribution layers 142 may be formed of a metal material. Examples of the metal material include copper (Cu), aluminum (Al), silver (Ag), tin (Sn), gold (Au), nickel (Ni), lead (Pb), titanium (Ti), and alloys thereof. The first redistribution layers 142 may serve various functions according to a circuit design of a corresponding layer. For example, the first redistribution layers 142 may include round patterns, power patterns, signal patterns, and the like. The signal patterns include various signals such as data signals, excluding ground patterns and power patterns. Here, the term 'pattern' is used to include wires and pads. The first redistribution layers 142 mainly include signal patterns in overlapped regions where the first semiconductor chip 120 overlaps the second or third semiconductor chip 161 or 162, and often include power and/or ground patterns in other (non-overlapped) regions.

The first connection vias 143 serve to electrically connect the layers formed at different levels to each other, such as the first redistribution layers 142, the first, third, and fourth connection pads 122, 161P, and 162P, and the wire layers 112a, 112b, and 112c, thereby forming an electrical path inside the connection structure 140. The first connection vias 143 may be formed of a metal material. Examples of the metal material include copper (Cu), aluminum (Al), silver (Ag), tin (Sn), gold (Au), nickel (Ni), lead (Pb), titanium (Ti), and alloys thereof. Each of the first connection vias 143 may be a filled-type via filled with a metal material, or may be a conformal-type via in which a metal material is formed along the inner wall of a via hole. Each of the first connection vias 143 may have a tapered cross-section. The tapered direction of the first connection vias 143 may be opposite to that of the wire/via layers 113a and 113b of the frame 110.

The first passivation layer 150 is an additional component for protecting the connection structure 140 from external physical or chemical damage. The first passivation layer 150 may include a thermosetting resin. For example, the first passivation layer 150 may be made of ABF, but is not limited thereto. The first passivation layer 150 may have a plurality of openings, each exposing at least a portion of an uppermost first redistribution layer 142. The openings may be provided in an amount of several tens to several tens of thousands, or in an amount more or less than several tens to several tens of thousands. Each of the openings may include a plurality of holes.

Each of the second and third semiconductor chips 161 and 162 may be an IC in which more than several hundreds to several millions of devices are integrated in a single chip. Each of the second and third semiconductor chips 161 and 162 may be, for example, a processor chip such as a CPU, a GPU, a FPGA, a digital signal processor, an encryption processor, a microprocessor, and/or a microcontroller, and in particular, each of the second and third semiconductor chips 161 and 162 may be an AP, but is not limited thereto. Each of the second and third semiconductor chips 161 and 162 may be a partitioned chip constituting a partial function of an AP, examples of the partitioned chip including a CPU, a GPU, a FPGA, a digital signal processor, an encryption processor, a microprocessor, and/or a microcontroller, and the like. As a non-limiting example, the first to third semiconductor chips 120, 161, and 162 may be combined together to form one complete AP. Here, the first semiconductor chip 120 may serve as a main chip of an AP, and the second and third semiconductor chips 161 and 162 may serve as sub-chips of the AP. However, the second and third semiconductor chips 161 and 162 are not limited thereto, and each may be a memory such as a DRAM, a ROM, and a flash memory.

Each of the second and third semiconductor chips 161 and 162 may be an active wafer-based die, and body portions of the second and third semiconductor chips 161 and 162 may be formed by using silicone (Si), germanium (Ge), gallium arsenic (GaAs), or the like, as a base material. Various circuits may be formed in their respective body portions. The third and fourth connection pads 161P and 162P are configured to electrically connect the second and third semiconductor chips 161 and 162 to other components, and may be formed using a metal material such as copper (Cu) and aluminum (Al), as a base material. A passivation layer exposing the third and fourth connection pads 161P and 162P may be formed on the body portions of the second and third semiconductor chips 161 and 162, respectively, and the passivation layer may be an oxide layer, a nitride layer, or the like, or may be a dual-layer of an oxide layer and a nitride layer. Furthermore, an insulating layer or the like may be disposed thereon if necessary. Each of the second and third semiconductor chips 161 and 162 may be a bare die, but if necessary, may be a packaged die in which an additional redistribution layer is formed on an active surface of each of the second and third semiconductor chips 161 and 162, the surface on which the third or fourth connection pads 161P and 162P are disposed.

The second and third semiconductor chips 161 and 162 are mounted on an upper surface of the connection structure 140 in a surface-mounted state by surface mount technology (SMT). The second and third semiconductor chips 161 and 162 may include electrical connection bumps 161B and 162B disposed on the third and fourth connection pads 161P and 162P, respectively. The electrical connection bumps 161B and 162B may be made of a metal such as copper (Cu). The second and third semiconductor chips 161 and 162 may be mounted on the upper surface of the connection structure 140 by low melting-point metal members 161s and 162s, such as solders including tin (Sn) or an alloy including tin (Sn). The low melting-point metal members 161s and 162s may be disposed in a plurality of openings of the first passivation layer 150 to be connected to the exposed first redistribution layer 142, and as a result, an electrical connection path can be provided. According to example embodiments, the low melting-point metal members 161s and 162s may be directly connected to the third and fourth connection pads 161P and 162P, respectively. Underfill resins 161r and 162r may be disposed below the second and third semiconductor chips 161 and 162, respectively. The underfill resins 161r and 162r may fix the second and third semiconductor chips 161 and 162, respectively. The underfill resins 161r and 162r may be disposed to at least partially cover the third and fourth connection pads 161P and 162P, the electrical connection bumps 161B and 162B, and the low melting point-metal members 161s and 162s. The underfill resins 161r and 162r may be, for example, an epoxy adhesive, but are not limited thereto.

The second redistribution layer 132 and second connection vias 133 may be disposed below the encapsulant 130. The second connection vias 133 may penetrate at least a portion of the encapsulant 130 to electrically connect a third wire layer 112c and the second redistribution layer 132 to each other.

The second redistribution layer 132 may serve to redistribute the first to fourth connection pads 122, 123, 161P, and 162P, and may provide the electrical connection path described above. The second redistribution layer 132 may be formed by using a metal material such as copper (Cu), aluminum (Al), silver (Ag), tin (Sn), gold (Au), nickel (Ni), lead (Pb), titanium (Ti), and alloys thereof. The second redistribution layer 132 may serve various functions according to a circuit design of a corresponding layer. For example, the second redistribution layer 132 may include a ground pattern, a power pattern, a signal pattern, or the like. The ground pattern and the signal pattern may be an identical pattern to each other. Here, the term 'pattern' used herein includes a wire and a pad.

The second connection vias 133 may electrically connect the third wire layer 112c and the second redistribution layer 132 to each other. The connection vias 133 may be formed using a metal material such as copper (Cu), aluminum (Al), silver (Ag), tin (Sn), gold (Au), nickel (Ni), lead (Pb), titanium (Ti), and an alloy thereof. The second connection vias 133 may be a filled-type via filled with a metal material or a conformal-type via in which a metal material is formed along the inner wall of a via hole. Each of the second connection vias 133 may have a tapered cross-section. The tapered direction may be the same as that of the first and second wire/via layers 113a and 113b. In an example embodiment, the number of layers of the second redistribution layer 132 and the second connection vias 133 may be variously modified.

The second passivation layer 180 is an additional component for protecting the frame 110 from external physical or chemical damage. The second passivation layer 180 may also include a thermosetting resin. For example, the second passivation layer 180 may be made of ABF, but is not limited thereto. The second passivation layer 180 may have a plurality of openings, each exposing at least a portion of the second redistribution layer 132. The openings may be provided in an amount of several tens to several tens of thousands, or in an amount more or less than several tens to several tens of thousands. Each of the openings may include a plurality of holes.

The electrical connection metals 190 may be an additional component for physically and/or electrically connecting the semiconductor package 100A to external components. For example, the semiconductor package 100A may be mounted on a mainboard of an electronic device through the electrical connection metals 190. The electrical connection metals 190 may be respectively disposed in a plurality of openings of the second passivation layer 180. Accordingly, the electrical connection metals 190 may be electrically connected to the exposed second redistribution layer 132. If necessary, under-bump metals may be formed in a plurality of openings of the second passivation layer 180 as needed, and in this case, the electrical connection metals 190 may be connected to the second redistribution layer 132 exposed through the under-bump metals. Each of the electrical connection metals 190 may include a low melting-point metal, for example, tin (Sn) or an alloy including tin (Sn). More particularly, for example, the electrical connection metals 190 may be formed by solders or the like. However, these are mere examples, and the electrical connection metals 190 are not limited to any particular material.

The electrical connection metals 190 may be lands, balls, pins, or the like. The electrical connection metals 190 may be formed in multiple layers or a single layer. The electrical connection metals 190, when formed in multiple layers, may include copper pillars and solders. Alternatively, the electrical connection metals 190, when formed as a single layer, may include tin-silver solders or copper, but these are mere examples, and the electrical connection metals 190 are not limited thereto. The electrical connection metals 190 are not particularly limited in the number, interval, arrangement, and the like thereof, and may be variously modified according to a specific design by a person skilled in the art. For example, the number of the electrical connection metals 190 may be from several tens to several tens of thousands depending on the number of the first to fourth connection pads 122, 123, 161P, and 162P, or may be more or less than this range.

At least one of the electrical connection metals 190 may be disposed in a fan-out region. The fan-out region refers to a region outside the region in which the first semiconductor chip 120 is disposed. Accordingly, the semiconductor package 100A according to an example may be a fan-out semiconductor package. The fan-out package has superior reliability as compared to the fan-in package, can implement a plurality of I/O terminals, and is advantageous for 3D interconnection. Also, compared to a ball grid array (BGA) package, a land grid array (LGA) package, and the like, the fan-out package can be fabricated with a smaller thickness and have a more competitive price.

The molding material 191 is an additional component for protecting the second and third semiconductor chips 161 and 162. The molding material 191 may be disposed to cover at least a portion of each of the second and third semiconductor chips 161 and 162. The molding material 191 may include a material different from the encapsulant 130. For example, the molding material 191 may be an epoxy molding compound (EMC). If necessary, for heat dissipation of the second and third semiconductor chips 161 and 162, the molding material 191 may be subject to a grinding treatment. As a result of the grinding treatment, upper surfaces of the second and third semiconductor chips 161 and 162, inactive surfaces, may be exposed. According to example embodiments, an additional package, for example, a memory package may be further disposed on top of the molding material 191 in the form of a package-on-package (POP).

Figure 11:
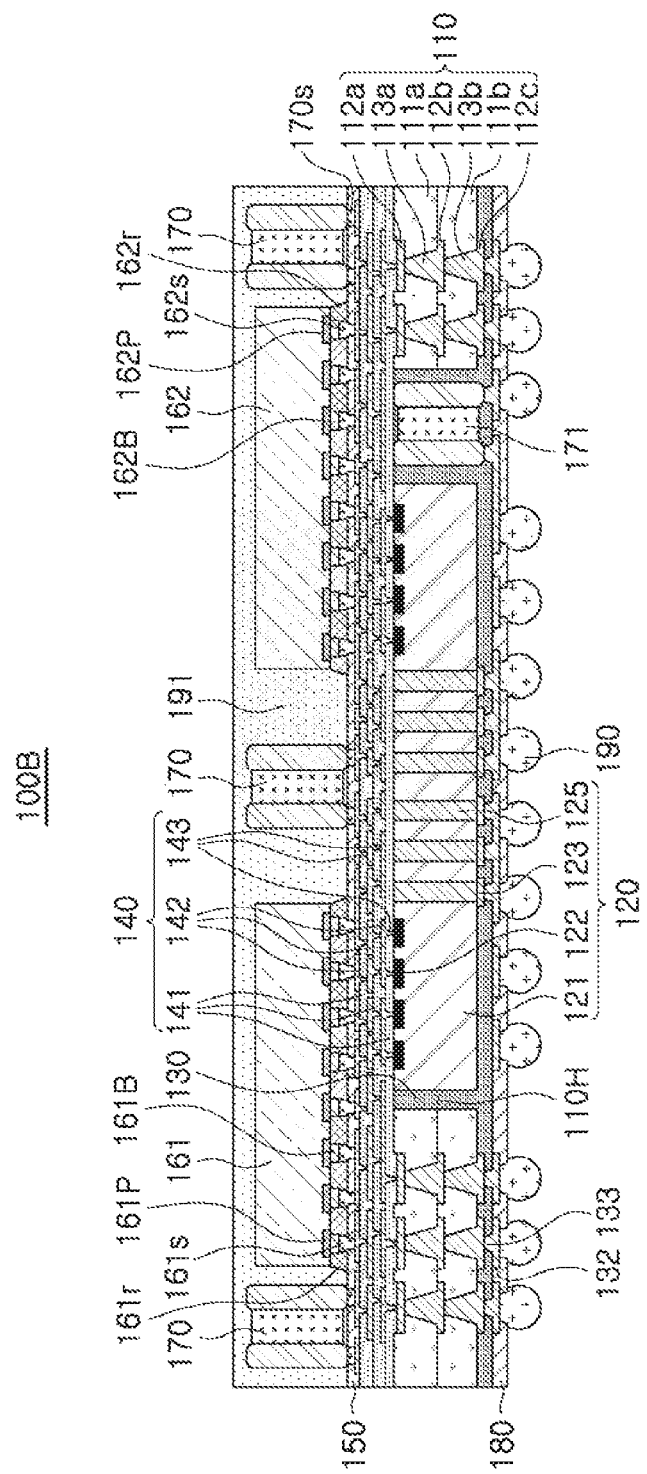
FIG. 11 is a cross-sectional view schematically illustrating another example of a semiconductor package.

FIG. 11 is a cross-sectional view schematically illustrating another example of a semiconductor package.

Referring to the drawings, a semiconductor package 100B according to another example further includes one or more passive components 170 disposed on the connection structure 140. In addition, the semiconductor package 100B may further include a passive component 171 disposed within the through-hole 110H of the frame 110. The first to fourth connection pads 122, 123, 161P, and 162P may be electrically connected to the passive components 170 and 171 depending on functions thereof. Without being limited thereto, a portion of the passive components 170 may be disposed between the second and third semiconductor chips 161 and 162, to overlap with the first semiconductor chip 120. Here, when the passive components 170 are disposed to overlap the first semiconductor chip 120, the first redistribution layer 142 of the connection structure 140 disposed therebelow may mostly include power patterns and/or ground patterns, thus optimizing a power path with the passive components 170. Also, according to an example embodiment, upper ends of the through-vias 125 of the first semiconductor chip 120 may be connected to the power patterns and/or ground patterns of the first redistribution layer 142 of the connection structure 140.

The passive components 170 are disposed in a surface-mounted state by low melting-point metals 170s such as solders. The passive components 171 inside the through-hole 110H may be connected to the second redistribution layer 132 by the second connection vias 133, but are not limited thereto. According to an example embodiment, the passive components 171 may be embedded inside the frame 110 to be electrically connected to at least a portion of the first to third wire layers 112a, 112b, and 112c, or may be modularized together with the frame 110 to be electrically connected to the first redistribution layer 142.

Each of the passive components 170 and 171 may be, for example, a chip-type capacitor such as an MLCC and LICC, or a chip-type inductor such as a power inductor, but is not limited thereto. Alternatively, each of the passive components 170 and 171 may be a passive component of a different kind commonly known in the related art. In other words, the passive components 170 and 171 may be chip-type passive components commonly known in the related art. Here, the chip-type component refers to a component in the form of an independent chip having a body, internal electrodes formed within the body, and external electrodes formed on the body. The passive components 170 and 171 may be of the same kind, or may be of different kinds from each other. The number of the passive components 170 and 171 is not particularly limited, and depending on the circuit design, may be more, or less than those illustrated in the drawings.

Components other than those described above are substantially identical to the components described with respect to the semiconductor package 100A and the like, and therefore detailed descriptions thereof will be omitted.

Figure 12:
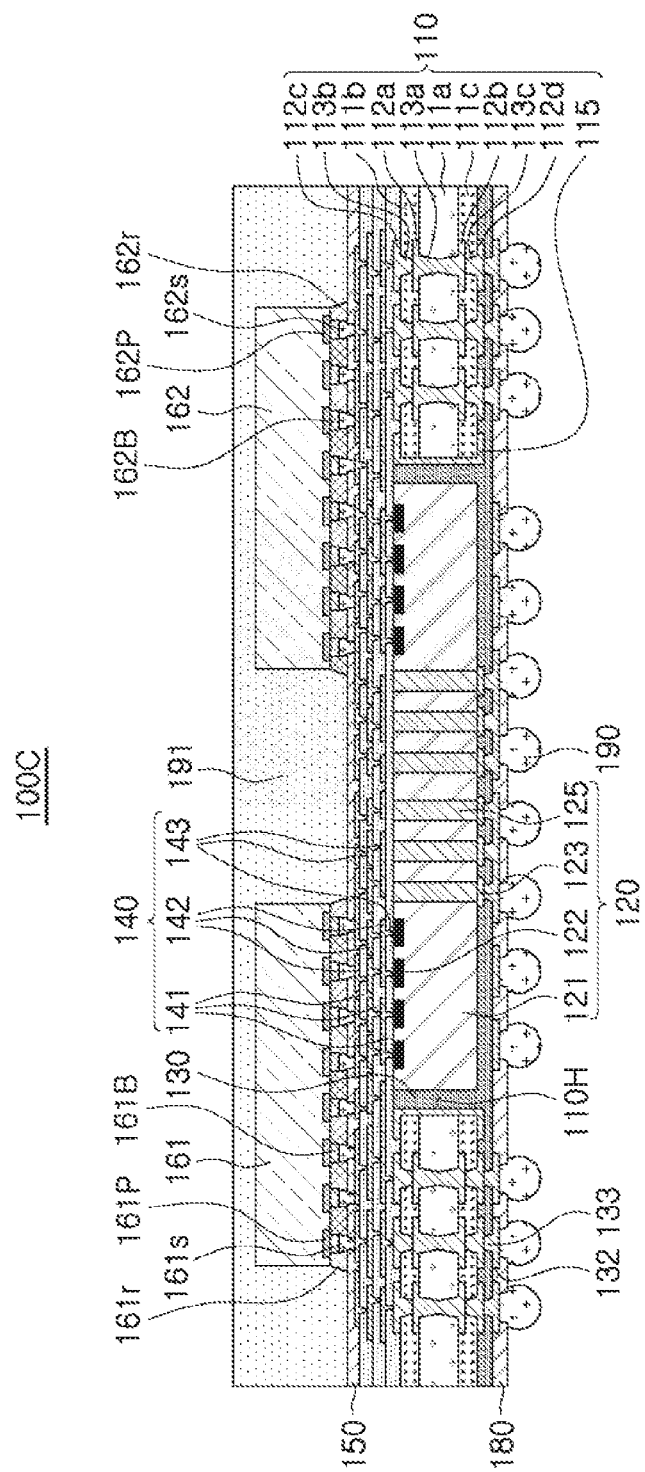
FIG. 12 is a cross-sectional view schematically illustrating another example of a semiconductor package.

FIG. 12 is a cross-sectional view schematically illustrating another example of a semiconductor package.

Referring to the drawings, a semiconductor package 100C according to another example may have the frame 110 in a different form. In particular, the frame 110 includes a first insulating layer 111a, a first wire layer 112a disposed on one surface of the first insulating layer 111a, a second wire layer 112b disposed on the other surface of the first insulating layer 111a, a second insulating layer 111b disposed on one surface of the first insulating layer 111a to cover the first wire layer 112a, a third insulating layer 111c disposed on the other surface of the first insulating layer 111a to cover the second wire layer 112b, a third wire layer 112c disposed on one surface of the second insulating layer 111b, opposite to the other surface of the second insulating layer 111b on which the first wire layer 112a is buried, a fourth wire layer 112d disposed on one surface of the third insulating layer 111c, opposite to the other surface of the third insulating layer 111c on which the second wire layer 112b is buried, a first wire/via layer 113a disposed to penetrate the first insulating layer 111a to electrically connect the first and second wire layers 112a and 112b to each other, a second wire/via layer 113b disposed to penetrate the second insulating layer 111b to electrically connect the first and third wire layers 112a and 113c to each other, and a third wire/via layer 113c disposed to penetrate the third insulating layer 111c to electrically connect the second and fourth wire layers 112b and 112d to each other. The frame 110 may further simplify the connection structure 140 due to including therein a greater number of wire layers 112a, 112b, 112c, and 112d.

The first insulating layer 111a may be thicker than each of the second insulating layer 111b and the third insulating layer 111c. The first insulating layer 111a may be formed relatively thicker in order to maintain basic hardness, and the second insulating layer 111b and the third insulating layer 111c may be incorporated into the frame 110 in order to accommodate a greater number of wire layers 112c and 112d. From a similar perspective, the wire vias of the first wire/via layer 113a penetrating the first insulating layer 111a may be formed to have a greater height and/or average diameter than that of wire vias of each of the second and third wire/via layers 113b and 113c penetrating the second and third insulating layers 111b and 111c. Also, while each of the wire vias of the first wire/via layer 113a may have the shape of an hourglass or cylinder, each of the wire vias of the second wire/via layer 113b may have a tapered shape tapered in an opposite direction to that of each of the wire vias of the third wire/via layer 113c. The thickness of each of the first to fourth wire layers 112a, 112b, 112c, and 112d may be greater than the thickness of a single first redistribution layer 142.

If necessary, the metal layer 115 may be further disposed on the inner wall of the through-hole 110H of the frame 110, and the metal layer 115 may be formed to completely cover the surface of the inner wall. The metal layer 115 may include a metal material such as copper (Cu). The first semiconductor chip 120 may have improved electromagnetic field-shielding effects and heat radiation through the metal layer 115.

Components, other than the ones described above, are substantially identical to the components described with reference to the semiconductor package 100A, and therefore will not be described. Also, it should be understood that the aforementioned characteristic features of the semiconductor package 100c are applicable to the semiconductor package 100B according to another example embodiment.

Figure 13:
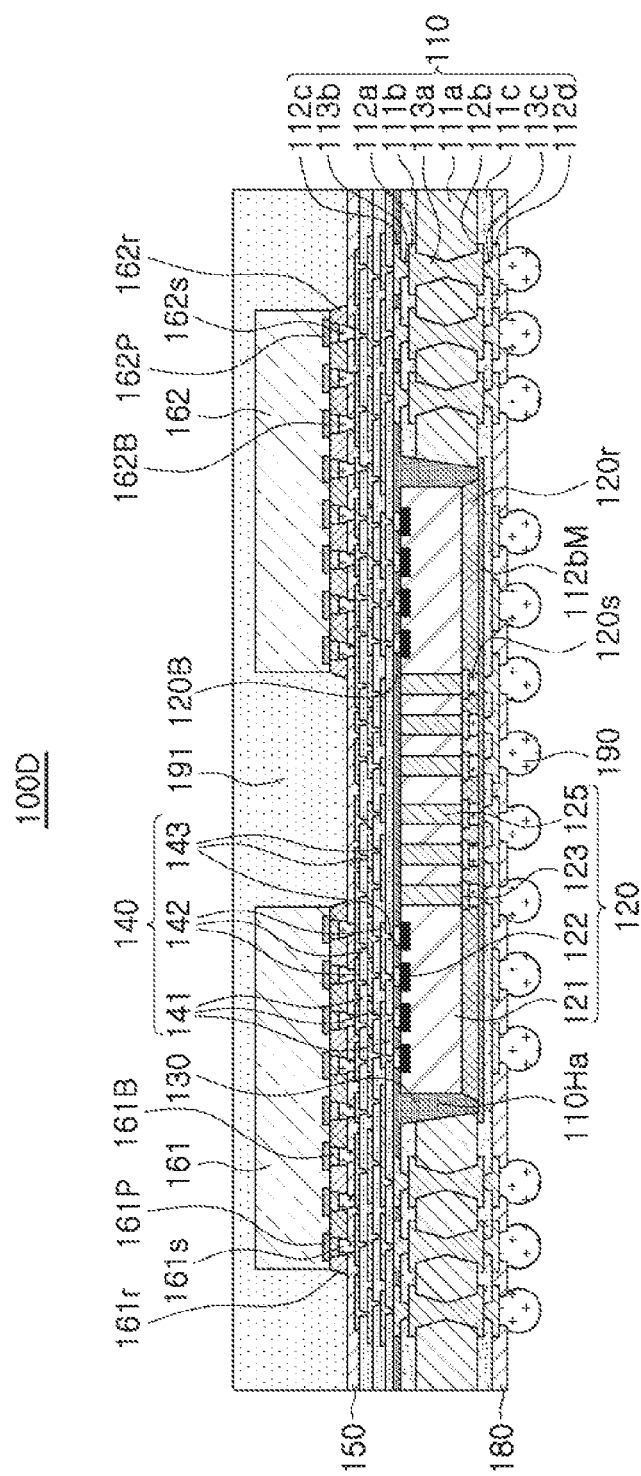
FIG. 13 is a cross-sectional view schematically illustrating another example of a semiconductor package.

FIG. 13 is a cross-sectional view schematically illustrating another example of a semiconductor package.

Referring to the drawings, in a semiconductor package 100D according to another example, a hole 110Ha of the frame 110 has a shape of a blind cavity. Accordingly, the hole 110Ha of the frame 110 includes a stopper layer 112bM disposed on a bottom surface thereof. The frame 110 includes a plurality of insulating layers 111a, 111b, and 111c, a plurality of wire layers 112a, 112b, 112c, and 112d, and a plurality of wire/via layers 113a, 113b, and 113c. The surface of the first semiconductor chip 120 on which the second connection pads 123 are disposed is attached to the stopper layer 112bM by using connection terminals such as low melting-point metals 120s on lower surfaces of the second connection pads 123. Accordingly, when the first semiconductor chip 120, which heats up the most, is disposed within the hole 110Ha, heat can be easily released from a lower surface of the package 100D through the stopper layer 112bM, which is a metal plate. For example, when the semiconductor package 100D is mounted on a printed circuit board or the like, heat can be easily released to the printed circuit board. Underfill resin 120r may be disposed below the first semiconductor chip 120 to fix the first semiconductor chip 120. The underfill resin 120r may be disposed to cover at least a portion of each of the second connection pads 123 and the low melting-point metal 120s. Also, at least one wire layer 112d of a plurality of wire layers 112a, 112b, 112c, and 112d may be disposed below the stopper layer 112bM. Such a wire layer 112d may function as a backside wire layer in a manner similar to the second redistribution layer 132 of FIG. 9, and therefore, the semiconductor package 100D has the advantage in that it does not require an additional backside process.

The hole 110Ha may be formed by a sandblasting process, and may be formed to have a predetermined angle of inclination. In this case, placement of the first semiconductor chip 120 may be easier. Furthermore, although not illustrated, a metal layer may be further disposed on an inner wall of the hole 110Ha of the frame 110, and EMF shielding effects and heat dissipation can be improved through the metal layer.

The stopper layer 112bM is disposed on a lower surface of the first insulating layer 111a, and a lower surface of the stopper layer 112bM is covered by the third insulating layer 111c while at least a portion of an upper surface of the stopper layer 112bM is exposed by the hole 110Ha. The hole 110Ha penetrates the first and second insulating layers 111a and 111b, and does not penetrate the third insulating layer 111c. However, these are mere examples, and by the stopper layer 112bM disposed on a lower surface of the third insulating layer 111c, the hole 110Ha may penetrate all of the first to third insulating layers 111a, 111b, and 111c. An edge region of the stopper layer 112bM, which is in contact with the first insulating layer 111a, may have a greater thickness than the thickness of an exposed region of the stopper layer 112bM that is exposed from the first insulating layer 111a by the hole 110Ha, and this is due to that a portion of the exposed region of the stopper layer 112bM can be also removed during the sandblasting process.

The stopper layer 112bM may be a metal plate including a metal such as titanium (Ti), copper (Cu), and the like. However, the material of the stopper layer 112bM is not limited thereto, and may include a material with a lower etching rate in the sandblasting process than that of copper (Cu), in order to increase processability of the sandblasting process. For example, the stopper layer 112bM may be an insulating film including an insulating material. More particularly, for example, the stopper layer 112bM may be a dry film photo-resist (DFR) including a photosensitive polymer.

The first semiconductor chip 120 may further include electrical connection bumps 120B connected to the first connection pads 122. The electrical connection bumps 120B may be made of a metal material such as copper (Cu). The semiconductor package 100D according to an example embodiment may undergo a grinding process for the encapsulant 130, and as a result, a surface of the third wire layer 112c, an uppermost wire layer of the frame 110, the surface disposed in contact with connection vias 143, may be disposed at a same level as a surface of the electrical connection bump 120B, disposed in contact with the connection vias 143. Here, the same level includes minute variations due to fabrication errors. Accordingly, the height of the connection vias 143 connecting the electrical connection bump 120B to a redistribution layer 142 may be substantially identical to the height of the connection vias 143 connecting the third wire layer 112c to the redistribution layer 142. Accordingly, when a surface on which the connection structure 140 is formed is planar, the insulating layers 141 can be formed to be planar as well. Accordingly, it is possible to fabricate finer redistribution layers 142, connection vias 143, and the like. If necessary, to prevent formation of copper (Cu) burr and the like, there may be an additional electrical connection metal disposed on the third wire layer 112c. In this case, since the additional electrical connection metal is subjected to grinding, the surface of the electrical connection metal disposed in contact with the connection vias 143 can achieve the aforementioned relationship.

Figure 14:
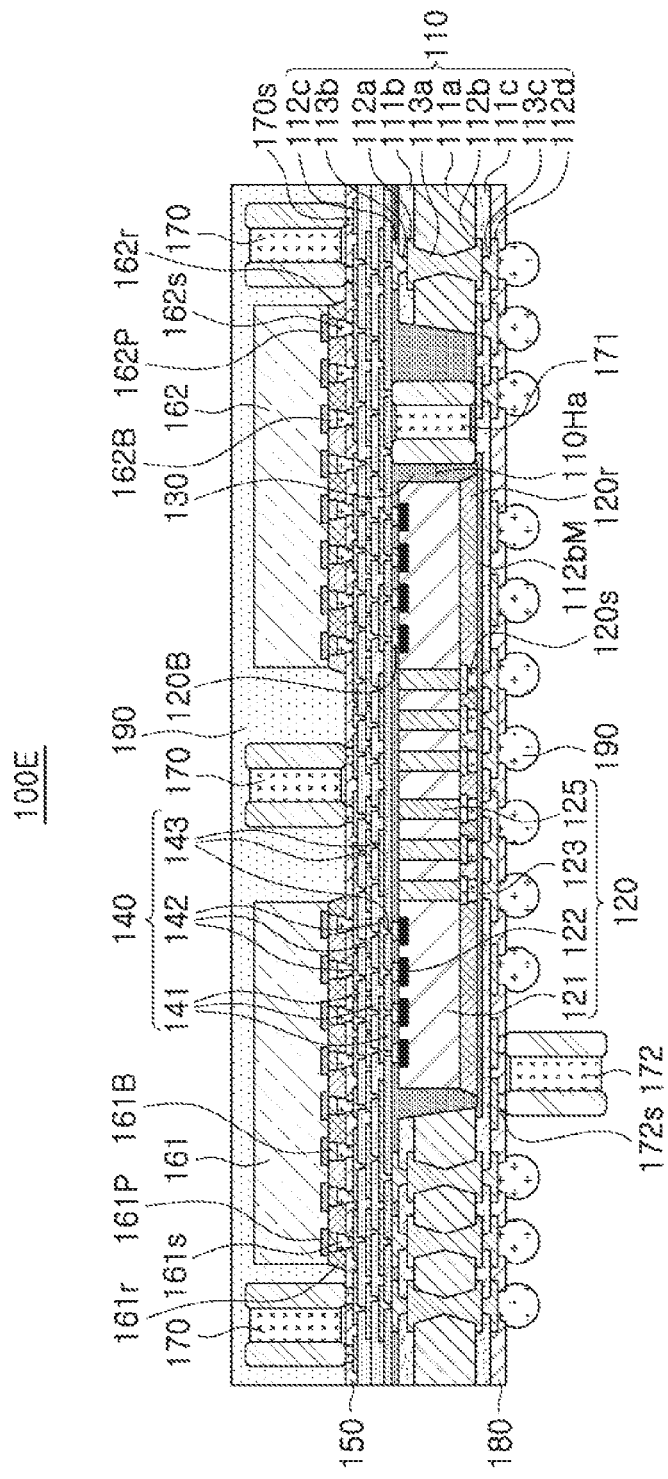
FIG. 14 is a cross-sectional view schematically illustrating another example of a semiconductor package.

FIG. 14 is a cross-sectional view schematically illustrating another example of a semiconductor package.

Referring to the drawings, a semiconductor package 100E according to another example may further include at least one of passive components 170 disposed on a connection structure 140, passive components 171 disposed within a hole 110Ha of a frame 110, and passive components 172 disposed below the frame 110. Depending on the function thereof, the first to fourth connection pads 122, 123, 161P, and 162P may be electrically connected to the passive components 170, 171, and 172. A portion of the passive components 170 disposed above the connection structure 140 may be disposed to overlap the first semiconductor chip 120, but is not limited thereto. The passive components 170 are disposed in a surface-mounted state by low melting-point metals 170s such as solders. The passive components 171 within the hole 110Ha may be connected to a first redistribution layer 142 disposed thereabove through first connection vias 143, may be connected to a second redistribution layer 112b of the frame 110 disposed therebelow, but are not limited thereto. According to example embodiments, the passive components 171 may be embedded within the frame 110 and electrically connected to at least a portion of the first to fourth wire layers 112a, 112b, 112c, and 112d, or may be modularized along with the frame 110 and electrically connected to the first redistribution layer 142. The passive components 172 disposed below the frame 110 may be connected to the fourth wire layer 112d of the frame 110, and for example, may be disposed in a surface-mounted state through low melting-point metals 172s such as solders.

The passive components 170, 171, and 172 may be chip-type capacitors such as MLCC and LICC, or chip-type inductors such as power inductors. The passive components 170, 171, and 172 may be of the same type to each other, or of a different type from each other. The number of the passive components 170, 171, and 172 is not particularly limited, and may be more or less than those illustrated in the drawings according to a particular circuit design.

Components other than the ones mentioned above are substantially identical to the ones described with reference to the semiconductor packages 100B and 100D and the like, and therefore will not be described in detail.

Figure 15:
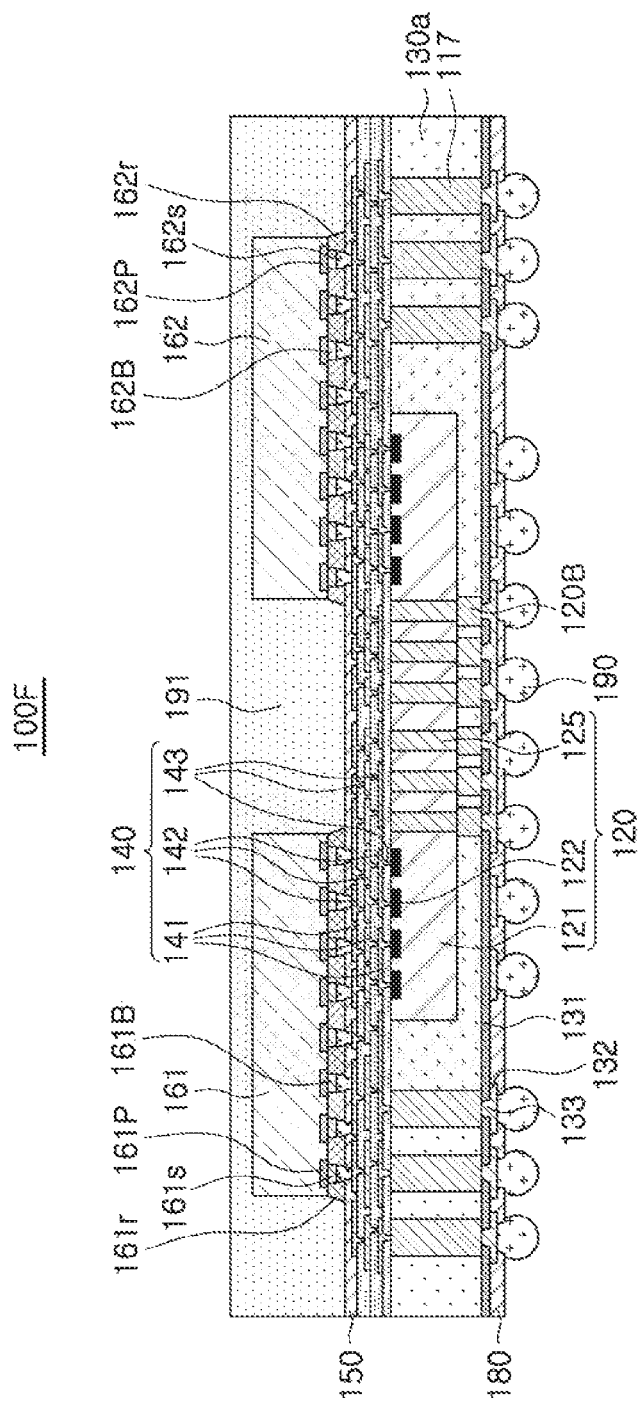
FIG. 15 is a cross-sectional view schematically illustrating another example of a semiconductor package.

FIG. 15 is a cross-sectional view schematically illustrating another example of a semiconductor package.

Referring to the drawings, a semiconductor package 100F according to another example, unlike the semiconductor package 100A of FIG. 9, does not include a frame 110. The first semiconductor chip 120 is disposed encapsulated in an encapsulant 130a. The first redistribution layer 142 of the connection structure 140 is electrically connected to the second redistribution layer 132 on the insulating layer 131 disposed therebelow, through a connection part 117 penetrating the encapsulant 130a. Instead of the second connection pads 123 of FIG. 9, electrical connection bumps 120B may be disposed on an inactive surface of the first semiconductor chip 120. According to example embodiments, the semiconductor package 100F may further include second connection pads (not shown), on which the electrical connection bumps 120B are disposed, respectively.

Components other than the ones mentioned above are substantially identical to the ones described with reference to the semiconductor package 100A, and therefore will not be described in detail.

According to example embodiments disclosed herein, a package structure capable of packaging a plurality of semiconductor chips with optimal signal and power characteristics may be provided.

The terms "lower side," "lower portion," "lower surface," and the like used herein refer to a side, a portion, a surface, and the like facing amounting surface of a fan-out semiconductor package, while "upper side," "upper portion," "upper surface," and the like are used to refer to a side, a portion, a surface, and the like facing an opposite direction thereof. However, these terms are defined as such for convenience of description, and therefore, should not be used to limit the scope of the present disclosure.

A statement that an element is "connected" or "coupled" to another element, it includes a case where the element is directly connected or coupled to the another element or is indirectly connected or coupled to the another element by using an adhesive layer or the like. Also, a statement that one element is "electrically connected" to another element includes a case where the two elements are physically connected to each other, and also a case where the two elements are not physically connected to each other. Also, the terms "first," "second," and variations thereof used herein do not denote any order and/or importance or the like, but rather are used to distinguish one element from another. In some cases, without departing from the scope of the present disclosure, a first element may be designated as a second element, and vice versa.

The term "embodiments" used in the present disclosure does not refer to the same embodiment, and embodiments are provided to highlight characteristic features of one embodiment to another embodiment. However, any one embodiment described herein may be combined with other features or characteristics described in respect of another embodiment. For example, it should be understood that features described with respect to one embodiment may apply to another embodiment unless explicitly stated otherwise.

The terms used in the present disclosure are used merely to illustrate embodiments of the present disclosure and not to limit the scope of the present disclosure. Furthermore, the use of the singular includes the plural unless specifically stated otherwise.

What is claimed is:

1. A semiconductor package, comprising:
   a first semiconductor chip having a first surface and a second surface opposing the first surface, and including first and second connection pads disposed on the first and second surfaces, respectively, and through-vias connected to the second connection pads;
   a connection structure disposed on the first surface of the first semiconductor chip and including a first redistribution layer electrically connected to the first connection pads of the first semiconductor chip;
   a second redistribution layer disposed on the second surface of the first semiconductor chip and electrically connected to the second connection pads of the first semiconductor chip; and
   a second semiconductor chip disposed on a third surface of the connection structure opposing a fourth surface of the connection structure on which the first semiconductor chip is disposed, wherein a surface of the second semiconductor chip, on which third connection pads of the second semiconductor chip are disposed, faces the third surface of the connection structure,
   wherein the second semiconductor chip is disposed to partially vertically overlap with the first semiconductor chip,
   wherein in the first semiconductor chip, the first connection pads are disposed not to vertically overlap with the second connection pads,
   wherein in the first semiconductor chip, the through-vias and the second connection pads are disposed in a central region of the first semiconductor chip, and the first connection pads are disposed in a peripheral region of the first semiconductor chip, and
   wherein the central region of the first semiconductor chip does not vertically overlap with the second semiconductor chip, and the peripheral region of the first semiconductor chip vertically overlaps with the second semiconductor chip.

2. The semiconductor package of claim 1, wherein a portion of the third connection pads of the second semiconductor chip is electrically connected to the first connection pads of the first semiconductor chip disposed therebelow by the first redistribution layer.

3. The semiconductor package of claim 1, wherein the through-vias of the first semiconductor chip extend from the second connection pads to the first surface by penetrating the first semiconductor chip or to penetrate at least a portion of an active layer disposed in contact with the first surface of the first semiconductor chip.

4. The semiconductor package of claim 1, wherein each of the first and second semiconductor chips constitutes a partial or entire function of an application processor (AP).

5. The semiconductor package of claim 1, further comprising a passive component disposed on the third surface of the connection structure.

6. The semiconductor package of claim 1, further comprising a frame disposed on the fourth surface of the connection structure and having a hole in which the first semiconductor chip is disposed, wherein the frame includes one or more wire layers electrically connected to the first redistribution layer.

7. The semiconductor package of claim 6, wherein the hole completely penetrates the frame, and the first semiconductor chip is disposed inside the hole, such that the first surface on which the first connection pads are disposed faces the fourth surface of the connection structure.

8. The semiconductor package of claim 7, further comprising:
   an encapsulant disposed on the fourth surface of the connection structure and covering at least a portion of each of the frame and the first semiconductor chip; and
   connection vias penetrating at least a portion of the encapsulant and configured to electrically connect the one or more wire layers to the second redistribution layer.

9. The semiconductor package of claim 7, wherein the frame includes: a first insulating layer disposed in contact with the fourth surface of the connection structure; a first wire layer disposed in contact with the fourth surface and buried in one surface of the first insulating layer; a second wire layer disposed on the other surface of the first insulating layer, opposing the one surface of the first insulating layer in which the first wire layer is buried; a second insulating layer disposed on the other surface of the first insulating layer, opposing the one surface of the first insulating layer in which the first wire layer is buried, wherein the second insulating layer covers at least a portion of the second wire layer; and a third wire layer disposed on one surface of the second insulating layer, opposing the other surface of the second insulating layer in which the second wire layer is buried, and
   wherein a surface of the first insulating layer, disposed in contact with the fourth surface of the connection structure, has a step with respect to a surface of the first wire layer disposed in contact with the fourth surface of the connection structure.

10. The semiconductor package of claim 7, wherein the frame includes: a first insulating layer; first and second wire layers, the first wire layer disposed on one surface of the first insulating layer, and the second wire layer disposed on the other surface of the first insulating layer; second and third insulating layers, the second insulating layer disposed on the one surface of the first insulating layer, and the third insulating layer disposed on the other surface of the first insulating layer, wherein the second insulating layer covers at least a portion of the first wire layer, and the third insulating layer covers at least a portion of the second wire layer; a third wire layer disposed on one surface of the second insulating layer, opposing the other surface of the second insulating layer which covers the at least a portion of the first wire layer; and a fourth wire layer disposed on one surface of the third insulating layer, opposing the other surface of the third insulating layer which covers the at least a portion of the second wire layer, and
   wherein the first insulating layer is thicker than each of the second and third insulating layers.

11. The semiconductor package of claim 6, wherein the hole has a shape of a blind cavity in which a stopper layer is disposed on a bottom surface thereof, and the frame includes the second redistribution layer,
   wherein the first semiconductor chip is disposed in the hole such that the second surface on which the second connection pads are disposed is attached to the stopper layer.

12. The semiconductor package of claim 11, further comprising a connection terminal in a shape of a solder or a bump
connected to the first connection pads.

13. The semiconductor package of claim 1, wherein in the first semiconductor chip, the through-vias are only connected to the second connection pads in the second surface such that the through-vias are not connected to the first connection pads in the first surface.

14. The semiconductor package of claim 1, wherein in the first semiconductor chip, the through-vias are disposed not to vertically overlap with the first connection pads.

15. The semiconductor package of claim 1, wherein the first redistribution layer redistributes the first connection pads of the first semiconductor chip to the third connection pads of the second semiconductor chip that are in an overlapping region of the second semiconductor chip that vertically overlaps with the first semiconductor chip and in a non-overlapping region of the second semiconductor chip that does not vertically overlap with the first semiconductor chip.

16. A semiconductor package, comprising:
- a first semiconductor chip having a first surface and a second surface opposing the first surface, and including first connection pads for transmitting and receiving signals disposed on the first surface and second connection pads for receiving power disposed on the second surface, and through-vias connected to the second connection pads;
- a connection structure disposed on the first surface of the first semiconductor chip, and including a first redistribution layer electrically connected to the first connection pads of the first semiconductor chip; and
- at least one second semiconductor chip disposed on a third surface of the connection structure opposing a fourth surface of the connection structure on which the first semiconductor chip is disposed, and a surface of the at least one second semiconductor chip on which third connection pads of the at least one second semiconductor chip are disposed faces the third surface of the connection structure,
wherein the at least one second semiconductor chip is disposed to partially vertically overlap with the first semiconductor chip,
wherein in the first semiconductor chip, all of the first connection pads are disposed not to vertically overlap with any of the second connection pads, and
wherein all of the through-vias are disposed not to vertically overlap with the at least one second semiconductor chip.

17. The semiconductor package of claim 16, further comprising a second redistribution layer disposed on the second surface of the first semiconductor chip and electrically connected to the second connection pads of the first semiconductor chip,
wherein the first connection pads are electrically connected to the first redistribution layer of the connection structure disposed thereabove, and the through-vias and the second connection pads are electrically connected to the second redistribution layer disposed therebelow.

* * * * *